(12) United States Patent
Chen et al.

(10) Patent No.: US 9,330,920 B1
(45) Date of Patent: May 3, 2016

(54) METHOD FOR FABRICATING SEMICONDUCTOR DEVICE

(71) Applicant: UNITED MICROELECTRONICS CORP., Hsin-Chu (TW)

(72) Inventors: Wei-Che Chen, Kaohsiung (TW); Chun-Mao Chiou, Chiayi County (TW)

(73) Assignee: UNITED MICROELECTRONICS CORP., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 14/660,913

(22) Filed: Mar. 17, 2015

(30) Foreign Application Priority Data

Feb. 17, 2015 (TW) .............................. 104105684 A

(51) Int. Cl.
*H01L 21/3205* (2006.01)
*H01L 21/4763* (2006.01)
*H01L 21/28* (2006.01)
*H01L 29/40* (2006.01)
*H01L 29/66* (2006.01)

(52) U.S. Cl.
CPC ........ *H01L 21/28008* (2013.01); *H01L 29/401* (2013.01); *H01L 29/66545* (2013.01)

(58) Field of Classification Search
CPC ............ H01L 29/4966; H01L 29/6656; H01L 29/6659; H01L 29/66628; H01L 29/66492; H01L 29/7836; H01L 29/7848; H01L 21/823412; H01L 21/823425; H01L 29/66636; H01L 29/66545; H01L 29/7834; H01L 29/7847; H01L 29/784
See application file for complete search history.

(56) References Cited

U.S. PATENT DOCUMENTS

| | | | |
|---|---|---|---|
| 8,372,719 B2 | 2/2013 | Wang et al. | |
| 8,796,084 B2 | 8/2014 | Tsai et al. | |
| 2014/0138745 A1* | 5/2014 | Shin | .................... H01L 29/4966 257/192 |
| 2014/0273368 A1* | 9/2014 | Hung | .................. H01L 29/6656 438/230 |

* cited by examiner

*Primary Examiner* — Charles Garber
*Assistant Examiner* — Abdulfattah Mustapha
(74) *Attorney, Agent, or Firm* — Winston Hsu; Scott Margo

(57) ABSTRACT

A method for fabricating semiconductor device is disclosed. The method includes the steps of: providing a substrate having a first region and a second region defined thereon; forming a gate structure on the first region, in which the gate structure comprises a first hard mask and a second hard mask thereon; forming a first mask layer on the first region and the second region; removing part of the first mask layer; removing the second hard mask; forming a second mask layer on the first region and the second region; removing part of the second mask layer; and removing the first hard mask.

9 Claims, 5 Drawing Sheets

METHOD FOR FABRICATING SEMICONDUCTOR DEVICE

BACKGROUND OF THE INVENTION

1. Field of the Invention

The invention relates to a method for fabricating semiconductor device, and more particularly, to a method of using two mask layers to remove two hard masks from gate structures sequentially.

2. Description of the Prior Art

With a trend towards scaling down size of the semiconductor device, conventional methods, which are used to achieve optimization, such as reducing thickness of the gate dielectric layer, for example the thickness of silicon dioxide layer, have faced problems such as leakage current due to tunneling effect. In order to keep progression to next generation, high-K materials are used to replace the conventional silicon oxide to be the gate dielectric layer because it decreases physical limit thickness effectively, reduces leakage current, and obtains equivalent capacitor in an identical equivalent oxide thickness (EOT).

On the other hand, the conventional polysilicon gate also has faced problems such as inferior performance due to boron penetration and unavoidable depletion effect which increases equivalent thickness of the gate dielectric layer, reduces gate capacitance, and worsens a driving force of the devices. Thus work function metals are developed to replace the conventional polysilicon gate to be the control electrode that competent to the high-K gate dielectric layer.

However, there is always a continuing need in the semiconductor processing art to develop semiconductor device renders superior performance and reliability even though the conventional silicon dioxide or silicon oxynitride gate dielectric layer is replaced by the high-K gate dielectric layer and the conventional polysilicon gate is replaced by the metal gate.

SUMMARY OF THE INVENTION

According to a preferred embodiment of the present invention, a method for fabricating semiconductor device is disclosed. The method includes the steps of: providing a substrate having a first region and a second region defined thereon; forming a gate structure on the first region, in which the gate structure comprises a first hard mask and a second hard mask thereon; forming a first mask layer on the first region and the second region; removing part of the first mask layer; removing the second hard mask; forming a second mask layer on the first region and the second region; removing part of the second mask layer; and removing the first hard mask.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
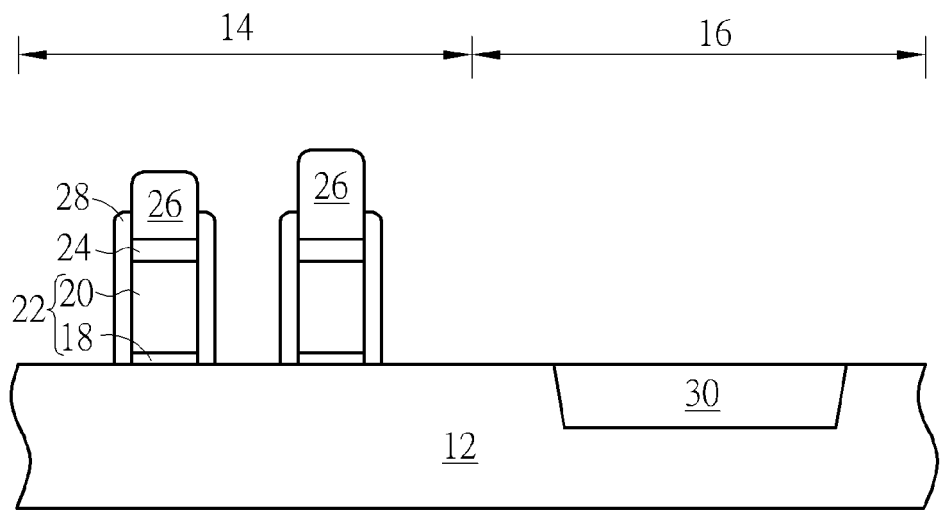
FIGS. 1-9 illustrate a method for fabricating semiconductor device according to a preferred embodiment of the present invention.

Referring to FIGS. 1-9, FIGS. 1-9 illustrate a method for fabricating semiconductor device according to a preferred embodiment of the present invention. As shown in FIG. 1, a substrate 12 is first provided, and a first region 14 and a second region 16 are defined on the substrate 12, in which the first region 14 could be a dense region while the second region 16 could be an iso region, but not limited thereto. In this embodiment, at least a gate structure 22 composed of gate dielectric layer 18 and gate electrode 20, a first hard mask 24 and a second hard mask 26 disposed on the gate structure 22, and a spacer 28 adjacent to two sides of the gate structure 22 are formed on the first region 14 or dense region. Depending on the region of the substrate 12 being placed, the second hard mask 26 on the gate structure 22 could have different height or thickness. For instance, despite the fact that the second hard mask 26 on the right gate structure 22 is slightly higher than the second hard mask 26 on the left gate structure 22, it is also be desirable to adjust the thickness of second hard mask 26 so that the second hard masks 26 on both gate structures 22 could have equal height, which is also within the scope of the present invention. In addition, the quantity of gate structures 22 is not limited to two as disclosed in this embodiment, but could be adjusted depending on the demand of the product. It should also be noted that even though the present embodiment pertains to a planar type transistor, it would also be desirable to apply the following process to non-planar transistors, such as FinFET devices and in such instance, the substrate 12 shown in FIG. 1 would then correspond to a fin-shaped structure on a substrate.

According to an embodiment of the present invention, the formation of the gate structure 22 could be achieved by sequentially forming a gate dielectric layer, a gate material layer, a first hard mask, and a second hard mask on the substrate 12, performing a pattern transfer process by using a patterned resist (not shown) as mask to remove part of second hard mask and first hard mask, part of gate material layer, and part of gate dielectric layer through single or multiple etching processes, and then stripping the patterned resist to form two gate structures 22 composed of patterned dielectric layer 18 and gate electrode 20 and patterned first hard mask 24 and patterned second hard mask 26 on the gate structures 22. Next, a material layer composed of silicon oxide or silicon nitride is formed on the substrate 12 to cover the second hard mask 26 on gate structure 22, and an etching back is conducted to remove part of the material layer for forming a spacer 28 adjacent to two sides of the gate structures 22. Preferably, the tip of the spacer 28 is between the top surface and bottom surface of the second hard mask 26.

According to an embodiment of the present invention, the substrate 12 could be a semiconductor substrate such as silicon substrate, epitaxial silicon substrate, silicon carbide substrate, or silicon-on-insulator (SOI) substrate, but not limited thereto. The gate dielectric layer 18 could be composed of $SiO_2$, SiN, or high-k material, and the gate electrode 20 could be composed of conductive material such as metal, polysilicon, or silicide. The first hard mask 24 and second hard mask 26 are preferably composed of different material thereby having different etching rate, in which the first hard mask 24 and second hard mask 26 could be selected from the material consisting of $SiO_2$, SiN, SiC, and SiON. In this embodiment, the second hard mask 26 is composed of silicon oxide and the first hard mask 24 is composed of silicon nitride, but not limited thereto. The material or etching rate of the spacer 28 is preferably the same as the first hard mask 24.

Figure 2:
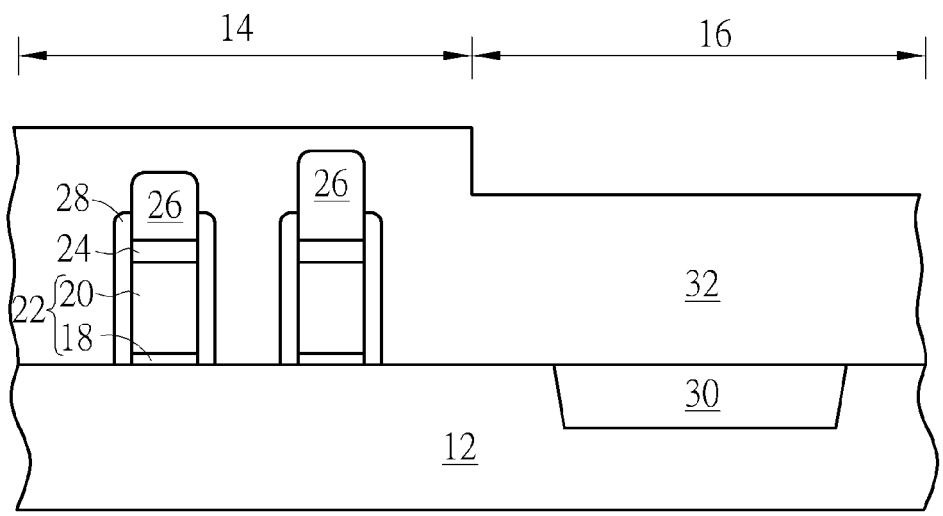

Next, as shown in FIG. 2, a first mask layer 32 is formed on the first region 14 and second region 16 to cover the second hard masks 26 on gate structures 22 entirely, in which the first mask layer 32 could be composed of resist material or organic dielectric layer (ODL), but not limited thereto. It should be noted that due to the presence of multiple gate structures 22 on first region 14, a difference in height is revealed between the first mask layer 32 on first region 14 and the first mask layer 32 on second region 16. For instance, a height difference of approximately 400 Angstroms is preferably observed between the top surface of first mask layer 32 on second region 16 and the top surface of first mask layer 32 on first region 14.

Figure 3:
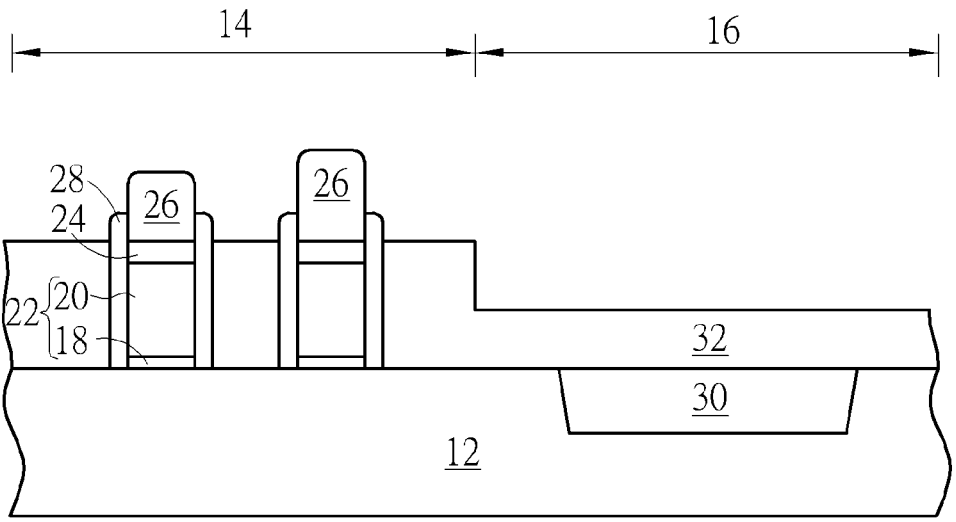

Next, as shown in FIG. 3, an etching back process is conducted to remove part of the first mask layer 32 on first region 14 and part of the first mask 32 on second region 16 for exposing the second hard masks 26 on the gate structures 22. In this embodiment, the top surface of the remaining first mask layer 32 on first region 14 after the etching back process is preferably lower than the tip of the spacer 28 and substantially aligned to the junction interface between first hard mask 24 and second hard mask 26. This exposes the top surface and part of the sidewalls of second hard masks 26. Preferably, the thickness of the remaining first mask layer 32 on second region 16 is larger than 100 Angstroms, or more preferably larger than 330 Angstroms.

Figure 4:
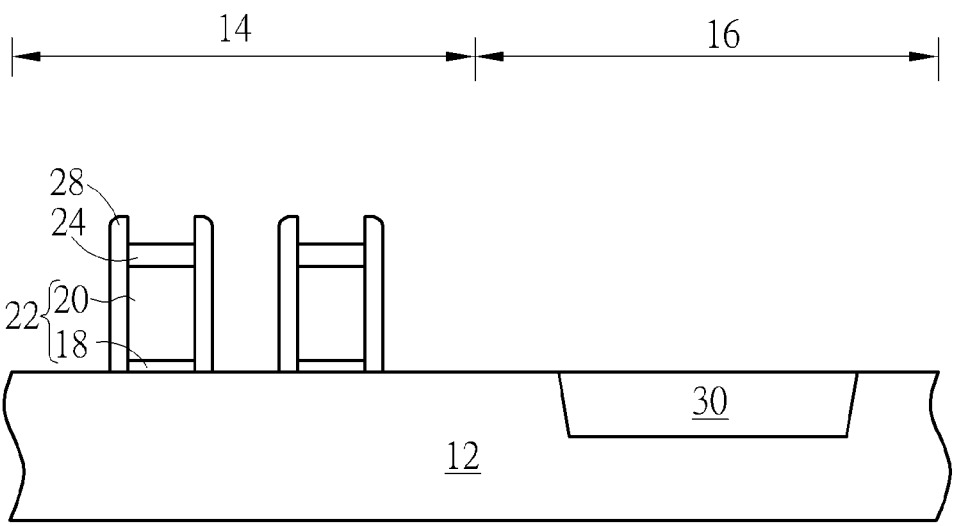

Next, as shown in FIG. 4, an etching process is conducted by using the etching selectivity between first hard mask 24 and second hard mask 26 to remove the second hard masks 26 completely and expose the top surface of first hard masks 24. Another etching process is conducted thereafter to remove the remaining first mask layer 32 entirely and expose the substrate 12 surface.

Figure 5:
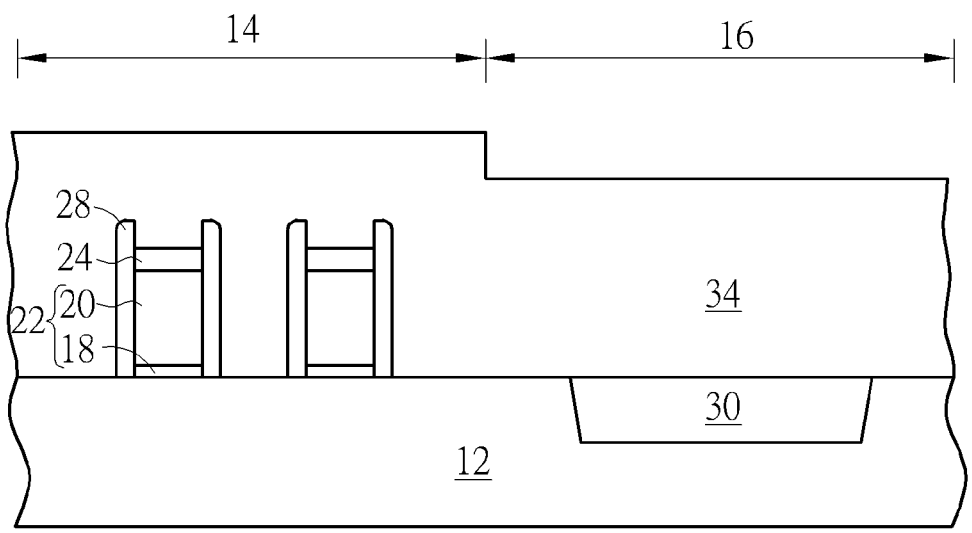

Next, as shown in FIG. 5, a second mask layer 34 is formed on the first region 14 and second region 16 to cover the gate structures 22, spacers 28, and first hard masks 24 entirely, in which the second mask layer 34 and the first mask layer 32 could be composed of same material or different material, with second mask layer 34 more preferably composed of resist material or ODL. Similar to the aforementioned step of forming first mask layer 32, due to the presence of multiple gate structures 22 on first region 14, a difference in height is observed between the second mask layer 34 on first region 14 and the second mask layer 34 on second region 16, and since only first hard masks 24 are remained on the gate structures 22, the height difference between second mask layer 34 on first region 14 and second mask layer 34 on second region 16 is slightly less than the height difference between first mask layer 32 on first region 14 and first mask layer 32 on second region 16. For instance, the height difference between top surface of second mask layer 34 on second region 16 and top surface of second mask layer 34 on first region 14 is approximately 200 Angstroms.

Figure 6:
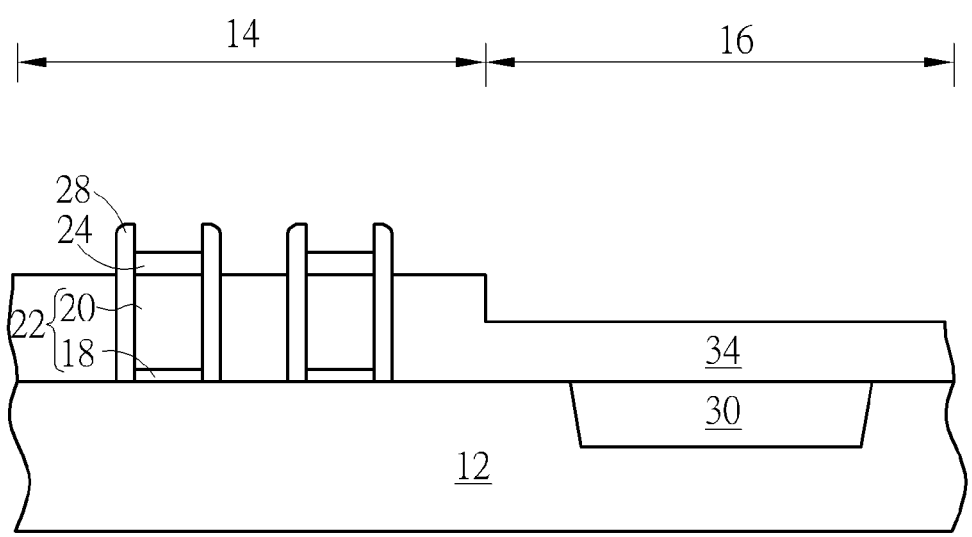

Next, as shown in FIG. 6, an etching back process is conducted to remove part of the second mask layer 34 on first region 14 and part of the second mask layer 34 on second region 16 at the same time to expose the first hard masks 24 on the gate structures 22. In this embodiment, the top surface of the remaining second mask layer 34 on first region 14 is preferably less than the tip of the spacer 28 and substantially aligned to the junction interface between the first hard mask 24 and gate electrode 20. This exposes the top surface of the first hard masks 24. Preferably, the thickness of the remaining second mask layer 34 on second region 16 is larger than 100 Angstroms, or more preferably larger than 330 Angstroms.

Figure 7:
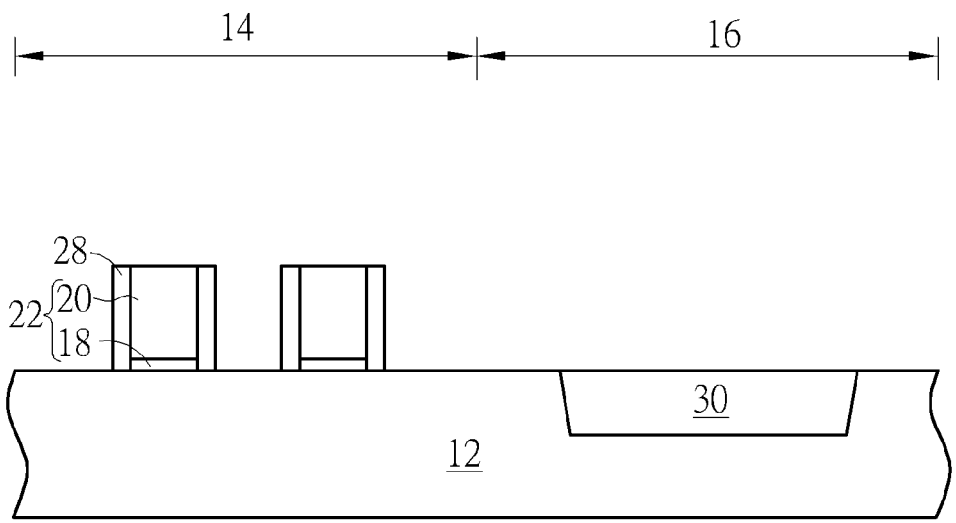

Next, as shown in FIG. 7, an etching process is conducted to remove the first hard masks 24 completely and part of the spacers 28 so that the top surface of the gate structures 22 and tip of the spacers 28 are coplanar. Another etching process is then conducted thereafter to remove the remaining second mask layer 34 completely and expose the substrate 12 surface.

Figure 8:
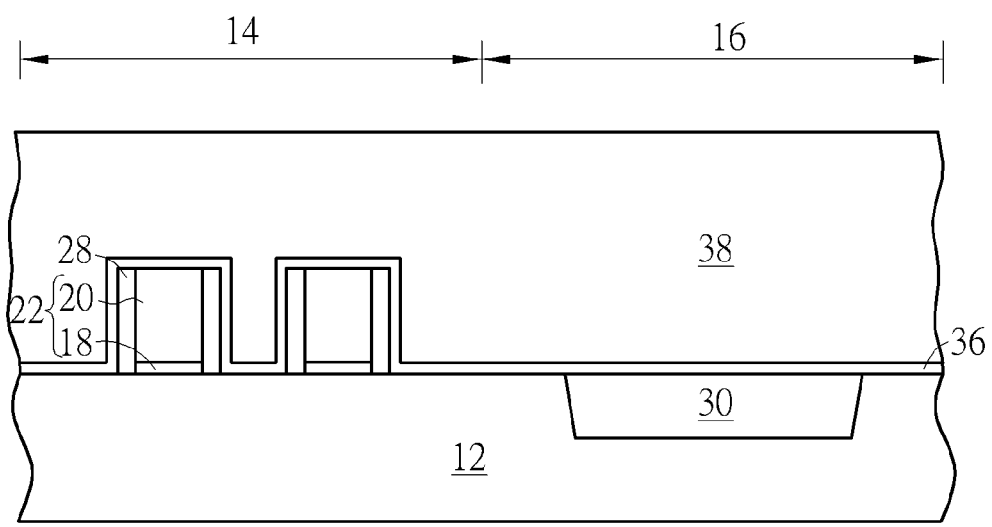

Typically, the gate structures 22 could be further processed by a gate first process, a high-k first approach from gate last process, or a high-k last approach from gate last process. Since the present embodiment pertains to a high-k first approach, a high-k dielectric layer (not shown) could be formed between gate electrode 20 and gate dielectric layer 18 of the gate structures 22. Next, as shown in FIG. 8, a source/drain region (not shown) and/or epitaxial layer (not shown) is formed in the substrate 12 adjacent to two sides of the spacer 28, a silicide layer (not shown) is selectively formed on the source/drain region and/or epitaxial layer, a contact etch stop layer (CESL) 36 is formed on the gate structures 22, and an interlayer dielectric (ILD) layer 38 is formed on the CESL 36.

Figure 9:
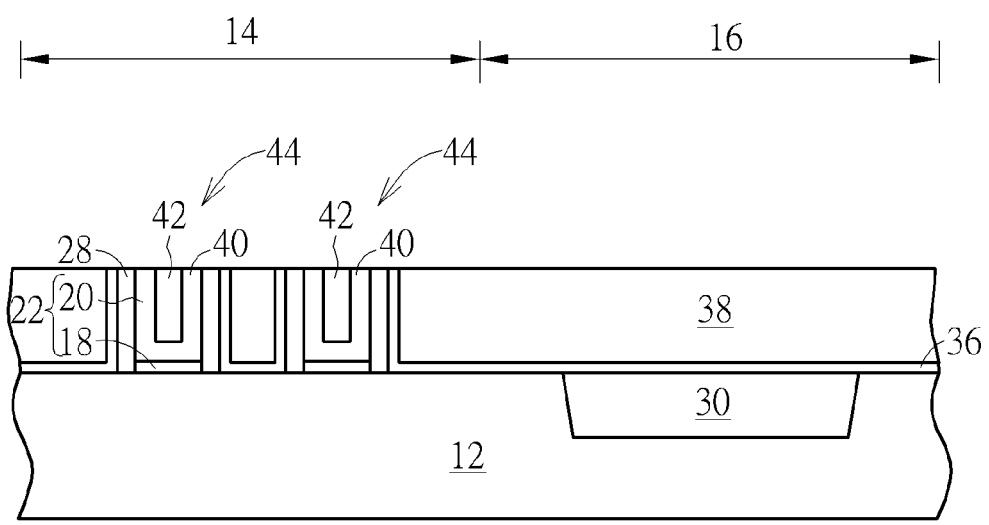

Next, as shown in FIG. 9, a replacement metal gate (RMG) process could be conducted to planarize part of the ILD layer 38 and CESL 36 and then transforming the gate structures 22 into metal gates 44. The RMG process could be accomplished by first performing a selective dry etching or wet etching process, such as using etchants including ammonium hydroxide ($NH_4OH$) or tetramethylammonium hydroxide (TMAH) to remove the polysilicon layer from gate structures 22 for forming a recess (not shown) in the ILD layer 38. Next, a conductive layer including at least a U-shaped work function metal layer 40 and a low resistance metal layer 42 is formed in the recess, and a planarizing process is conducted so that the surfaces of the U-shaped work function layer 40 and low resistance metal layer 42 are even with the surface of the ILD layer 38. Preferably, the high-k dielectric layer (not shown) could be I-shaped or U-shaped depending on whether the layer is fabricated by a high-k first process or high-k last process.

In this embodiment, the work function metal layer 40 is formed for tuning the work function of the later formed metal gates to be appropriate in an NMOS or a PMOS. For an NMOS transistor, the work function metal layer 40 having a work function ranging between 3.9 eV and 4.3 eV may include titanium aluminide (TiAl), zirconium aluminide (ZrAl), tungsten aluminide (WAl), tantalum aluminide (TaAl), hafnium aluminide (HfAl), or titanium aluminum carbide (TiAlC), but is not limited thereto. For a PMOS transistor, the work function metal layer 40 having a work function ranging between 4.8 eV and 5.2 eV may include titanium nitride (TiN), tantalum nitride (TaN), tantalum carbide (TaC), but is not limited thereto. An optional barrier layer (not shown) could be formed between the work function metal layer 40 and the low resistance metal layer 42, in which the material of the barrier layer may include titanium (Ti), titanium nitride (TiN), tantalum (Ta) or tantalum nitride (TaN). Furthermore, the material of the low-resistance metal layer 42 may include copper (Cu), aluminum (Al), titanium aluminum (TiAl), cobalt tungsten phosphide (CoWP) or any combination thereof. This completes the fabrication of a semiconductor device according to a preferred embodiment of the present invention.

Overall, the present invention uses two mask layer coatings with etching process after formation of gate structure to sequentially remove two hard masks on top of the gate structure. Preferably, a first mask layer is formed on the substrate, part of the first mask layer is removed by etching process to expose the second hard mask, the remaining first mask layer is used to completely remove the second hard mask on gate structure, a second mask layer is formed on the substrate, part of the second hard mask is removed by etching process to expose the first hard mask, and the remaining second mask layer is used to completely remove the remaining first hard mask and part of the spacer. In contrast to the conventional art of only forming one single mask layer on the substrate and then using the single mask layer to remove one single hard mask or two hard masks simultaneously from gate structure, the approach of the present invention by forming two mask layers separately and removing two hard masks sequentially could protect devices on the substrate effectively, such as preventing shallow trench isolation structures on iso region from damaged caused by etchant when mask layers are removed.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for fabricating semiconductor device, comprising:
   providing a substrate having a first region and a second region defined thereon;
   forming a gate structure on the first region, wherein the gate structure comprises a first hard mask and a second hard mask thereon;
   forming a first mask layer on the first region and the second region;
   removing part of the first mask layer;
   removing the second hard mask;
   forming a second mask layer on the first region and the second region after removing part of the first mask layer;
   removing part of the second mask layer; and
   removing the first hard mask.

2. The method of claim 1, wherein the second region of the substrate comprises a shallow trench isolation (STI).

3. The method of claim 1, wherein the first hard mask, the second hard mask, and the first mask layer comprise different material.

4. The method of claim 1, further comprising forming a spacer adjacent to the gate structure before forming the first mask layer.

5. The method of claim 4, wherein tip of the spacer is between the top surface and bottom surface of the second hard mask.

6. The method of claim 4, further comprising:
   forming the first mask layer on the first region and the second region to cover the gate structure entirely;
   removing part of the first mask layer so that the top surface of the remaining first mask layer is lower than the tip of the spacer; and
   removing the second hard mask completely.

7. The method of claim 4, further comprising:
   forming the second mask layer on the first region and the second region to cover the gate structure entirely;
   removing part of the second mask layer so that the top surface of the remaining second mask layer is lower than the bottom surface of the first hard mask; and
   removing the first hard mask completely and part of the spacer.

8. The method of claim 1, further comprising completely removing the first mask layer after removing the second hard mask and before forming the second mask layer.

9. The method of claim 1, further comprising:
   removing the second mask layer after removing the first hard mask;
   forming a contact etch stop layer (CESL) on the first region and the second region;
   forming an interlayer dielectric (ILD) layer on the CESL;
   planarizing the ILD layer and the CESL; and
   transforming the gate structure into a metal gate.

* * * * *